US008084695B2

(12) United States Patent
Hsu et al.

(10) Patent No.: US 8,084,695 B2
(45) Date of Patent: Dec. 27, 2011

(54) VIA STRUCTURE FOR IMPROVING SIGNAL INTEGRITY

(76) Inventors: Hsiuan-ju Hsu, Ping-tung (TW); Richard Walter Ziolkowski, Tucson, AZ (US)

( * ) Notice: Subject to any disclaimer, the term of this patent is extended or adjusted under 35 U.S.C. 154(b) by 1006 days.

(21) Appl. No.: 11/651,338

(22) Filed: Jan. 10, 2007

(65) Prior Publication Data
US 2008/0314631 A1    Dec. 25, 2008

(51) Int. Cl.
*H05K 1/11* (2006.01)
*H05K 1/14* (2006.01)
(52) U.S. Cl. ........................................ 174/262; 361/794
(58) Field of Classification Search .......... 174/262–266; 361/792–795
See application file for complete search history.

(56) References Cited

U.S. PATENT DOCUMENTS

| | | | |
|---|---|---|---|
| 5,949,030 A * | 9/1999 | Fasano et al. | 174/262 |
| 6,479,764 B1 * | 11/2002 | Frana et al. | 174/262 |
| 7,360,308 B2 * | 4/2008 | Oggioni et al. | 29/852 |
| 2002/0017399 A1 * | 2/2002 | Chang et al. | 174/262 |
| 2002/0153167 A1 * | 10/2002 | Miller | 174/261 |
| 2008/0185180 A1 * | 8/2008 | Cheng et al. | 174/266 |

FOREIGN PATENT DOCUMENTS
TW        95117616        5/2006
* cited by examiner

*Primary Examiner* — Jeremy Norris

(57) ABSTRACT

The embodiment of the invention is about a novel via structure which can be incorporated into printed circuit boards, integrated circuit packages, and integrated circuits in order to reduce crosstalk, to improve signal integrity and to achieve EM emission compliance. A 4-layer (2 signal layers and 2 power layers or 2 signal layers and 2 ground layers) circuit board assembly was used for demonstrating the effect of the novel via structure. The same concept can be applied to any multi-layer circuit board. Layers that have an electrical property can be added above, under, or within the basic 4-layer circuit board to achieve a multi-layer circuit board. For 2-layer and 3-layer circuit boards, a deformed version of the proposed via structure based upon the same concept will be needed for a coplanar waveguide configuration.

13 Claims, 14 Drawing Sheets

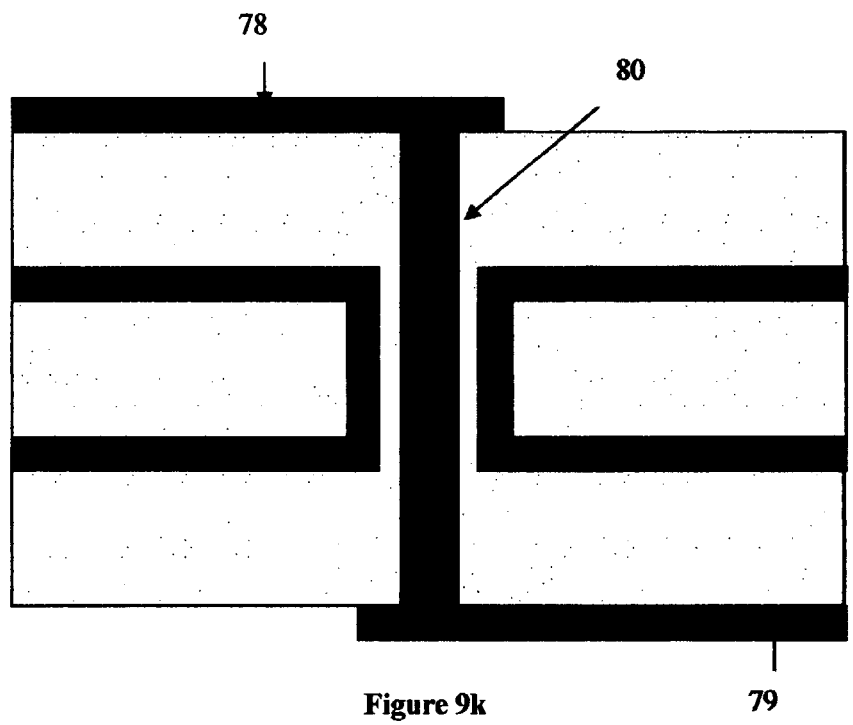
Figure 9k
Figure 10a

Figure 10b
Figure 10c

VIA STRUCTURE FOR IMPROVING SIGNAL INTEGRITY

CROSS REFERENCE TO RELATED APPLICATIONS

The invention relates to an application that is entitled "Circuit Board Via Structure for High Speed Signaling," (Publication NO.: US 20006/0237227 A1), which is filed presently with the U.S. Patent & Trademark Office, and which is used herein for reference in its entirety.

FIELD OF THE INVENTION

The embodiments of this invention relate to printed circuit boards and integrated circuit packaging boards, and in particular to a novel via structure for improving the signal integrity and reducing the EMC/EMI problem. The novel via structure can be incorporated into a variety of integrated, as well as other types of circuits.

BACKGROUND

In multilayer printed circuit boards, integrated circuit packages, and integrated circuits on dies, there are many situations in which signals need to switch from layer to layer. FIG. 1 and FIG. 3 show two situations of signal switching. From FIG. 1, a signal trace 2 on the top layer switches to the signal trace 9 on the bottom layer through the signal via 3. The signal propagating along via 3 will pass through the two metal planes 7 and 8, which can be either a power plane or ground plane. When the signal propagates through via 3, it will generate an electromagnetic (EM) wave. The EM wave will propagate between the two metal planes 7 and 8, causing voltage fluctuations that will degrade the signal integrity. Also, the impedance of the signal propagating in a trace will be different from that of the signal propagating in a via. This is the so-called impedance discontinuity.

This impedance discontinuity will affect the signal quality as well. The dashed lines of FIGS. 5 and 7 show the simulated insertion loss ($S_{21}$) of the signal path indicated in FIG. 1 for the PCB board-level via and the IC packaging-level via, respectively. A smaller insertion loss value indicates that there is more energy dissipated along the signal path. These energy losses could be due to EM radiation, impedance discontinuity, dielectric loss, and so on.

From FIG. 3, a signal propagating along trace 23 on the third layer switches to a signal propagating along trace 30 on the fifth layer through the signal via 24. The signals on traces 23 and 30 will be referenced to the metal planes 28 and 29, respectively. The metal planes 28 and 29 can be power planes or ground planes. When the signal propagates along the signal via 24, it will also generate an EM wave. The EM wave will propagate between the two metal planes 28 and 29 and will cause voltage fluctuations that will degrade the signal integrity.

Again, the impedance along the signal trace will be different from that along the signal via. This impedance discontinuity will also affect the signal quality. The dashed lines of FIG. 6 and FIG. 8 show the simulated insertion loss ($S_{21}$) associated with the signal path indicated in FIG. 3 for the PCB board-level via and the IC packaging-level via, respectively. Again, the smaller insertion Joss values indicate that there is more energy dissipated along the signal path. These energy losses could be due to EM radiation, impedance discontinuity, dielectric loss, and so on.

SUMMARY

The embodiment of the invention is about a novel via structure which can be incorporated into printed circuit boards, integrated circuit packages, and integrated circuits in order to reduce crosstalk, to improve signal integrity and to achieve EM emission compliance. A 4-layer (2 signal layers and 2 power layers or 2 signal layers and 2 ground layers) circuit board assembly was used for demonstrating the effect of the novel via structure. The same concept can be applied to any multi-layer circuit board. Layers that have an electrical property can be added above, under, or within the basic 4-layer circuit board to achieve a multi-layer circuit board. For 2-layer and 3-layer circuit boards, a deformed version of the proposed via structure based upon the same concept will be needed for a coplanar waveguide configuration.

The 4-layer circuit board can be separated into 3 types of circuit structures.

Type A (see FIG. 2): one signal layer is on the top layer; 2 ground layers or 2 power layers represent the two middle layer; and the other signal layer is on the bottom layer. The signal via connects the transmission lines that lie on the top and bottom layers. The ground via or power via is plated surrounding the signal via, i.e. the ground via or power via is concentric to the signal via. The plated ground via or the power via needs to be kept a non-trivial distance (such as the diameter of the anti-pad) from the signal via to avoid shorting. The impedance of the signal via can be properly designed by adjusting this distance between the signal via and the ground via (or power via). The thickness of the plated ground via (or power via) must be larger than the skin depth at the frequency of the signal. It is assumed that copper will be used for the ground via or power via in this implementation. The plated via connects the third layer of the ground plane (or power plane) to the fifth layer of the ground plane (or power plane) to be ground via (or power via). Note that it is necessary that the third layer and the fifth layer have the same electrical properties. With this configuration the signal via can be isolated to prevent electromagnetic coupling with other vias (not shown in the figure) on the circuit board. Also, the plated ground via (or power via) provides a voltage reference or a complete current return path for the signal propagating through the signal via. Eventually, the impedance discontinuity between the transmission line and the signal via will be reduced so that the subsequent reflection effect and, hence, the return loss will be minimized. Due to the separation of the signal vias by using the plated ground via (or power via), the crosstalk between signal vias will also be reduced to improve the quality of the signals. Consequently, the radiation on the edge of the circuit board (EMC/EMI problem) will be minimized as well.

Type B (see FIG. 4): the top layer and bottom layer are ground layers or power layers. The third layer and the fifth layer are signal layers. The signal via connects the transmission line on the third layer with the transmission line on the fifth layer. A ground via or power via is created to connect the top layer with the bottom layer. The diameter of the ground via or power via is smaller than that of the signal via to avoid shorting. The impedance of the signal via can be properly designed by controlling the distance between signal via and the ground via (or power via) as well. The ground via or power via is concentric to the signal via. Note that it is necessary that the top layer and the bottom layer have the same electrical properties. The thickness of the plated ground via or power via is larger than the skin depth associated with the frequency of the signal. The ground via or power via is assumed to be a highly conductive metal, such as copper, in this implementation. Also, the ground via (or power via) provides a voltage reference plane or a complete current return path for the signal propagating through the signal via. Finally, the impedance discontinuity between the transmission line and the signal via will be reduced so that the subsequent reflection effect and, hence, the return loss will be minimized. Consequently, the radiation on the edge of the circuit board (EMC/EMI problem) will be minimized as well.

Type C (see FIG. 2 or FIG. 4): Refer to Type A or Type B. The signal layers are replaced with power layers or ground layers. The resulting configurations, i.e., the stack from the top to the bottom layers, turn out to have the generic structure: power-ground-ground-power or ground-power-power-ground. When the signal via is replaced with a power via or a ground via, the via structure will become a "capacitor", an element that can store electrical energy. The value of the capacitor can be properly designed by filling the space between the power via and ground via with a material having a selected permittivity value, or by adjusting the distance between the power via and ground via. The addition of a capacitor will benefit the power integrity because the voltage fluctuations between the power plane and the ground plane can be minimized. Finally, the overall signal integrity of the system will be improved due to the reduction of the voltage fluctuations in these layers.

BRIEF DESCRIPTION OF THE DRAWING

FIGS. 9a-9k show the sequential fabrication steps required for the formation of the novel via structure shown in FIG. 2.

FIGS. 10a-10j show the sequential fabrication steps required for the formation of the novel via structure shown in FIG. 4.

TABLE 1

Figure 1:
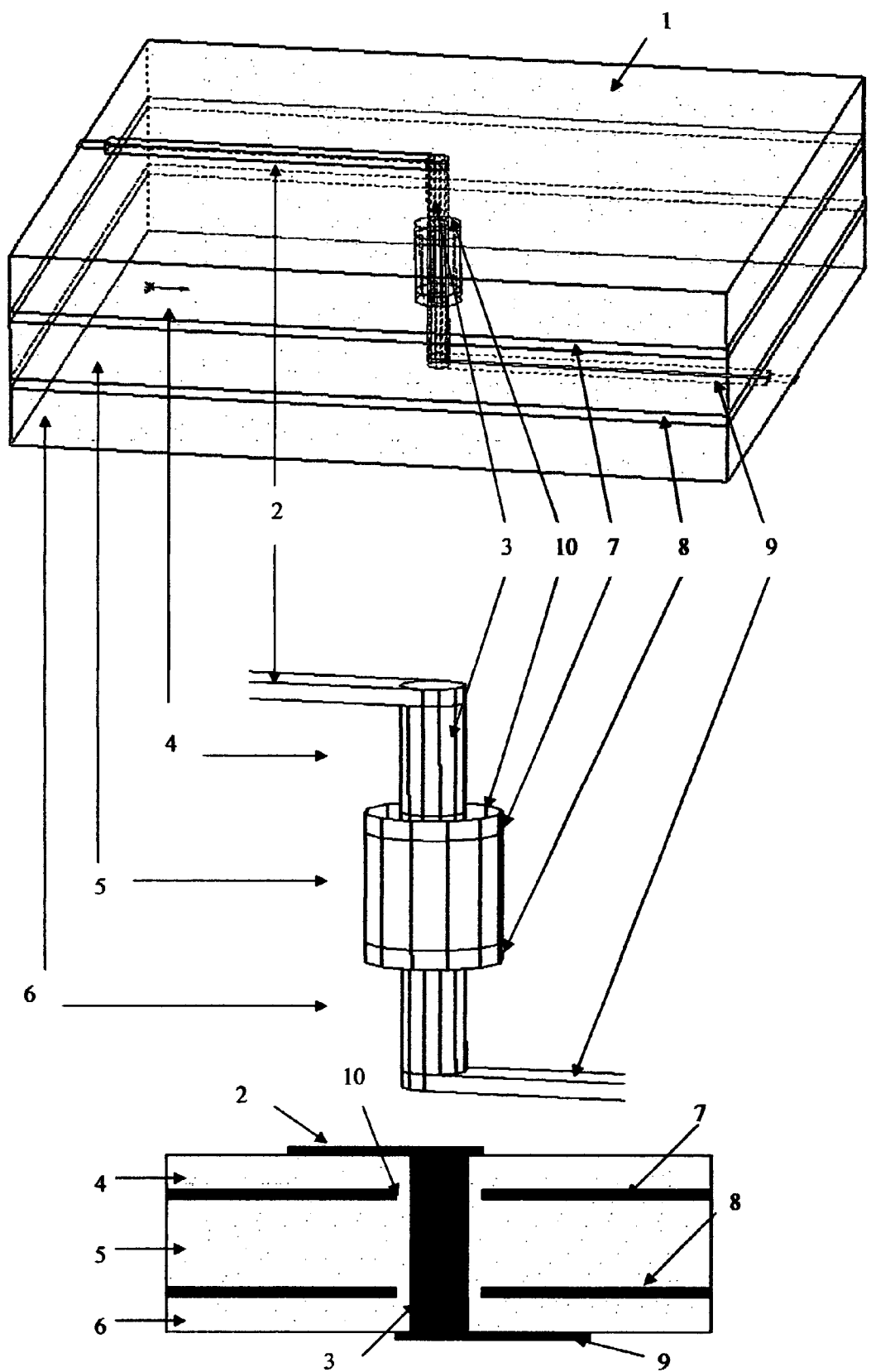
FIG. 1 shows a prior microstrip-like signal via structure without a power via or a ground via

The elements of FIG. 1

| | |
|---|---|
| Printed circuit board (PCB) or substrate or die | 1 |
| The first signal trace in first layer | 2 |
| The signal via | 3 |
| The first medium in the second layer | 4 |
| The second medium in the fourth layer | 5 |
| The third medium in the sixth layer | 6 |
| The first power plane or ground plane in the third layer | 7 |
| The second power plane or ground plane in the fifth layer | 8 |
| The second signal trace in the seventh layer | 9 |
| Anti-pad | 10 |

TABLE 2

Figure 2:
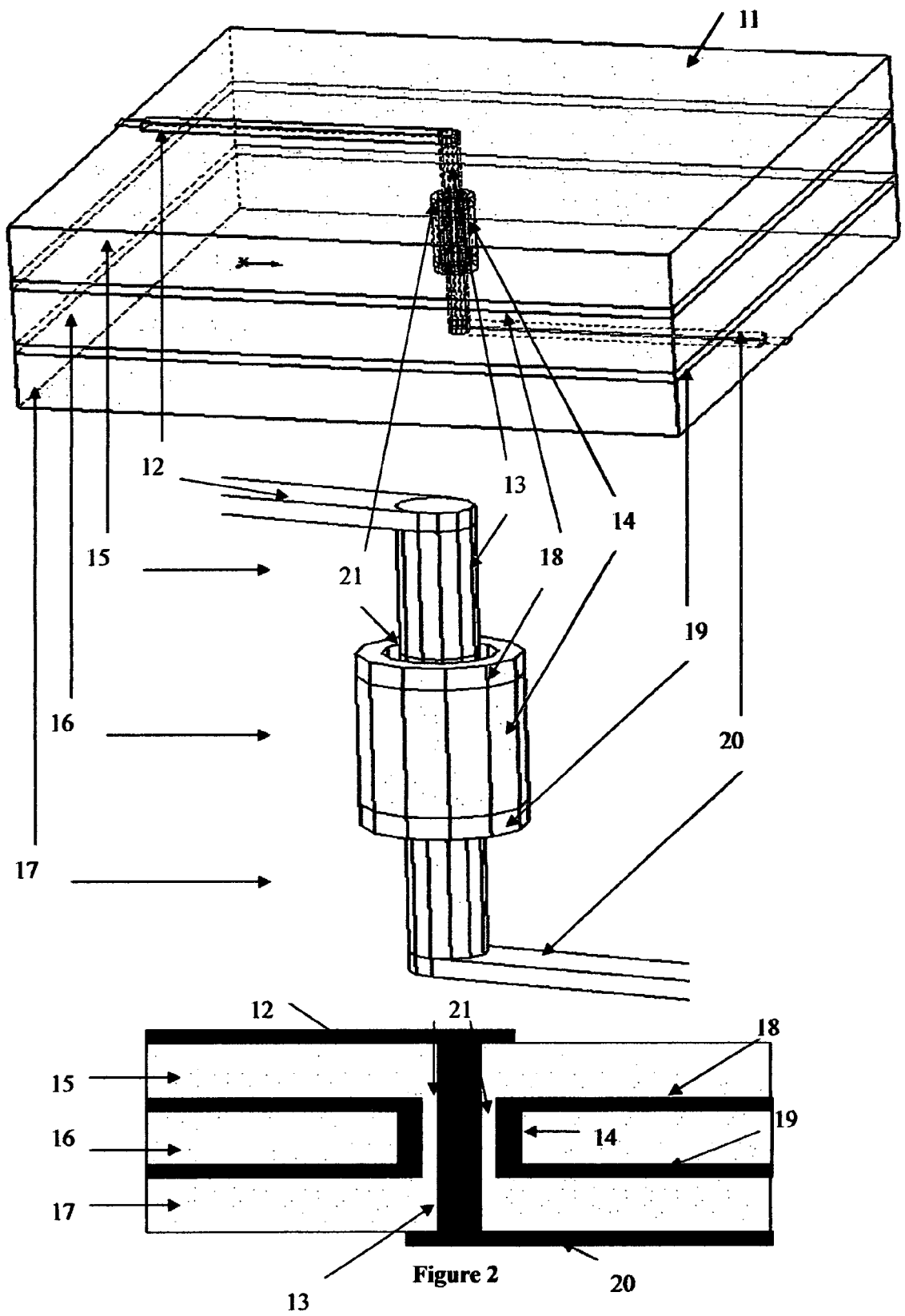
FIG. 2 shows a novel microstrip-like signal via surrounded by a power via and a ground via

The elements of FIG. 2

| | |
|---|---|
| Printed circuit board (PCB) or substrate or die | 11 |
| The first signal trace in the first layer | 12 |
| The signal via | 13 |
| The power via (or ground via) | 14 |
| The first medium in the second layer | 15 |
| The second medium in the fourth layer | 16 |
| The third medium in the sixth layer | 17 |
| The first power plane (or ground plane) in the third layer | 18 |
| The second power plane (or ground plane) in the fifth layer | 19 |
| The second signal trace in the seventh layer | 20 |
| Anti-pad | 21 |

TABLE 3

Figure 3:
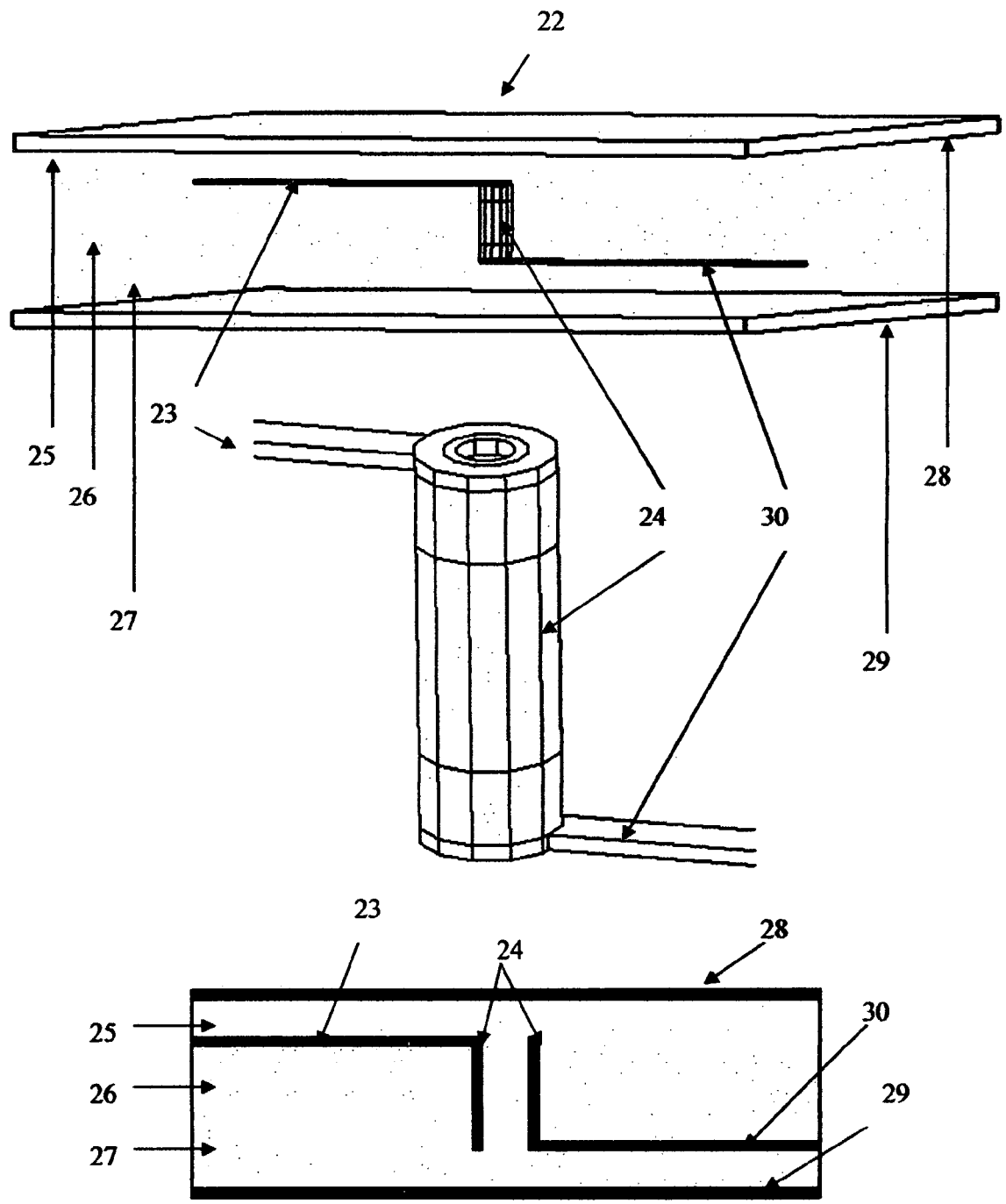
FIG. 3 shows prior stripline-like signal via without a power via or a ground via

The elements of FIG. 3

| | |
|---|---|
| Printed circuit board (PCB) or substrate or die | 22 |
| The first signal trace in the third layer | 23 |
| The signal via | 24 |
| The first medium in the second layer | 25 |
| The second medium in the fourth layer | 26 |
| The third medium in the sixth layer | 27 |
| The first power plane or ground plane in the first layer | 28 |
| The second power plane or ground plane in the seventh layer | 29 |
| The second signal trace in the fifth layer | 30 |

TABLE 4

Figure 4:
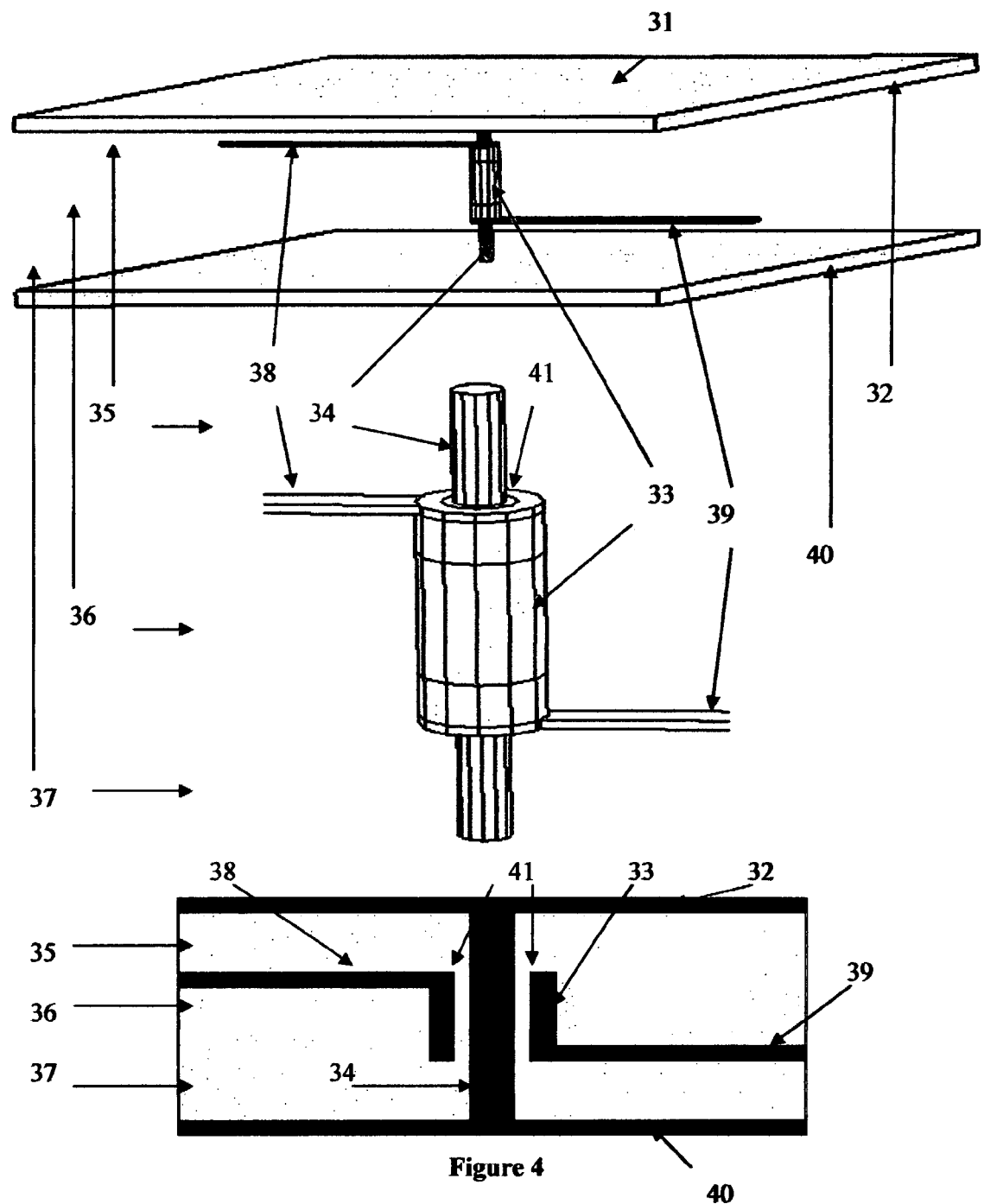
FIG. 4 shows a novel stripline-like signal via surrounding the power via and the ground via

The elements of FIG. 4

| | |
|---|---|
| Printed circuit board (PCB) or substrate or die | 31 |
| The first power plane (or ground plane) in the first layer | 32 |
| The signal via | 33 |
| The power via (or ground via) | 34 |
| The first medium in the second layer | 35 |
| The second medium in the fourth layer | 36 |
| The third medium in the sixth layer | 37 |
| The first signal trace in the third layer | 38 |
| The second signal trace in the fifth layer | 39 |
| The second power plane (or ground plane) in the seventh layer | 40 |
| Anti-pad | 41 |

DETAILED DESCRIPTION

The purpose of the invention is to provide a novel via structure that can reduce via-to-via crosstalk, the impedance discontinuity, and EMC radiation. In particular, the signal integrity will be improved and the edge radiation of the PCB board or IC packaging will be minimized.

A 4-layer (2 signal layers and 2 power layers or 2 ground layers) circuit board with a single via structure is used for demonstrating the interest of the invention. The 4-layer circuit board is comprised of 2 signal layers, 3 medium layers, 2 power layers (or 2 ground layers), and a via structure. The signal via electrically connects the signal traces on the different layers. The power via or ground via could be built outside the signal via (see FIG. 2) or inside the signal via (see FIG. 4). For the power via (or ground via) built outside the signal via, the thickness of the power via (or ground via) must be larger than the skin depth associated with the frequency of the signal on the signal via. Consequently, the EM wave generated by the signal via will not penetrate through the power via (or ground via) and, as a result, the via-to-via crosstalk will be mitigated. Also, the power via (or ground via) will provide the signal a shortest current return path and will reduce the impedance discontinuity. This in turn will minimize the return loss and, hence, will improve the signal integrity. For the power via (or ground via) built inside the signal via, the thickness of the power via (or ground via) must also be larger than the skin depth associated with the frequency of the signal on the signal via to reduce the losses in the metal. The power via (or ground via) will provide the signal a shortest current return path and will reduce the impedance discontinuity to minimize the return loss and improve the signal integrity.

Four circuit structures (FIG. 1-FIG. 4) are used to explain the concept of the invention. Each circuit structure comprises 2 signal layers, 3 medium layers, 2 power layers (or 2 ground layers), and a via structure. The concept of the invention can be applied to integrated circuit packaging, integrated circuits on a die, or many other types of circuits.

FIG. 1 is a prior via structure implemented on the circuit board 1. There is no power via or ground via between the power planes (or ground planes). Therefore, when the signal via 3 passes through the power planes (or ground planes), the signal will generate EM waves between the planes and these EM waves will fluctuate the voltages on the various planes. Moreover, there is a discontinuity between the impedances associated with the signal traces and the signal via. The subsequent reflected signals will also affect the signal quality.

FIG. 2 is used for demonstrating the implementation of the Type A version of the invention. The novel via structure alleviates the factors which adversely affect the signal integrity such as via-to-via coupling, impedance discontinuity, EM radiation, and so on. The circuit board is comprised of a substrate 11; two signal layers 12 and 20; two power layers (or two ground layer) 18 and 19; a signal via 13; and a power via (or a ground via) 14. The signal layer 12 is electrically connected to the signal layer 20 by the signal via 13. The power via (or ground via) 14 electrically connects the two power layers (or the two ground layer) 18 and 19; it is plated and surrounds the signal via 13. The power via (or ground via) 14 will provide a complete voltage reference surface and the shortest current return path for the signal that propagates along the signal via 13. Also, the power via (or ground via) 14 will isolate any electromagnetic (EM) wave generated by the signal via 13 and, hence, it will prevent any EM couplings with other vias (not shown).

The via structures that passes through the substrate 11 can be formed by mechanical Or laser drilling. The via hole can be a "blind hole" or "through hole". First, the power blind via (or ground blind via) 14 is formed in order to connect the two power layers (or the two ground layers). The material of the power via (or ground via) can be any highly conductive alloy or metal such as Tin (Sn), silver (Ag), copper (Cu), gold (Au). The signal layer 12 is then electrically connected with the signal layer 20 through the signal via 13. Any techniques such as casting, plating, or non-plating can be adapted for the formation of any via in the embodiments of the invention.

The power via (or ground via) 14 is plated with copper in this example of the invention. The signal via 13 and the power via (or ground via) 14 are circular and concentric. However, they do not necessarily have to be circular or concentric. For example, the signal via 13 can be a solid cylinder or a hollow cylinder non-centric with the power via (ground via) 14. Also, the signal via 13 must be kept at least a distance equal to the size of the anti-pad from the power via (or ground via) 14. The thickness of the power via (or ground via) 14 must be larger than the "skin depth" associated with the frequency of the signal propagating along the signal via 13. The skin depth describes the fact that any current flowing in a conductor will migrate toward the surface or "skin" of the conductor when the signal frequency gets higher. As a result, most of the current will be concentrated within the skin depth of the conductor. The skin depth $\delta s=(2/\omega\mu\sigma)\hat{0}(\frac{1}{2})$, where $\omega$ is the frequency of the signal, $\mu$ is the permeability of the conductor, and $\sigma$ is the conductivity of the conductor. Therefore, if the conductor is thick enough, the EM wave generated by the signal via will not penetrate through the power via (or ground via). As a result, the insertion loss ($S_{21}$) due to radiation emitted by the signal via will be minimized and, consequently, the via-to-via coupling will be reduced. Therefore, the signal integrity will be improved.

FIG. 3 is the other prior via structure. It is shown on the circuit board 22. There is no power via (or ground via) between the power planes (or ground planes) 28 and 29. Therefore, when the signal via 24 passes through the power planes (or ground planes) 28 and 29, the signal propagating along it will generate EM waves between these planes and these EM waves will cause fluctuations in the voltage on those planes. Also, the impedance between the signal traces and the signal via is discontinuous so there will be reflected signals and they will affect the signal quality.

FIG. 4 is used for the demonstration of the implementation of the Type B version of the invention. This novel via structure also alleviates the factors of affecting signal integrity such as via-to-via coupling, impedance discontinuity, EM radiation, and so on. The circuit board comprises a substrate 31; two signal layers 38 and 39; two power layers (or two ground layers) 32 and 40; a signal via 33; and a power via (or a ground via) 34. The signal layer 38 is electrically connected to the signal layer 39 with the signal via 33. The signal via 33 that electrically connects the two signal layers 38 and 39 is plated and surrounds the power via (or ground via) 34. The power via (or ground via) 34 will provide a complete voltage reference surface and the shortest current return path for the signal propagating along the signal via 33. Also, any EM waves generated by the signal via 33 will be concentrated between the power via (or ground via) 34 and the signal via 33 so that the signal via 33 will couple less energy with other vias (not shown).

Again, the via structures passing through the substrate 31 can be formed by mechanical or laser drilling. The via hole can be a "blind hole" or a "through hole". First, the signal blind via 33 is formed to connect electrically the signal layer 38 and the signal layer 39. The power through via (or ground through via) 34 then is formed to connect the two power layers (or the two ground layers) 32 and 40. The power via (or ground via) 34 can be plated to form a circular annular tube or filled with copper to form a solid cylinder. The material of the power via (or ground via) can be any conductive alloy or metal such as Tin (Sn), silver (Ag), copper (Cu), gold (Au). Any standard technique such as casting, plating, or non-plating can be adapted for the formation of any via in the embodiments of the invention.

The signal via 33 is plated with copper in this example. The signal via 33 and the power via (or ground via) 34 are circular and concentric. However, it is not necessary that they be a circular annular tube or that they be concentric. For example, the power via (ground via) 34 can be a cylindrical ring, solid cylinder, or polygon ring which can be concentric or not with the signal via 33. Also, the signal via 33 must be kept at least a distance equal to the size of the anti-pad from the power via (or ground via) 34. The thickness of the power via (or ground via) 34 must be larger than the "skin depth" associated with the frequency of the signal propagating along the signal via 33. Therefore, most of the return current induced by the signal via will propagate along the power via (or ground via) 34 instead of propagating partially along the power via (or ground via) 34 and partially through the medium (not shown). The insertion loss ($S_{21}$) due to the metal losses in the power via (or ground via) will be minimized. The via-to-via EM coupling will be reduced as well. Finally, the signal integrity will be improved.

The construction of the novel via structure shown in FIGS. 2 and 4 can be accomplished using typical PCB fabrication techniques. FIGS. 9a-9k show the sequential steps required for the fabrication of the novel via structure shown in FIG. 2. FIGS. 10a-10j show the required sequential steps for the fabrication of the novel via structure shown in FIG. 4.

Figure 9A:

FIG. 9a shows the dielectric substrate 52 plated with conductive metal planes on both sides, 51 and 53. The conductive metal planes will be used as power planes or ground planes. The material, FR4 is commonly used as the dielectric material for PCB boards. Any proper dielectric material can be used for these printed circuit boards, including Low Temperature Co-fired Ceramics (LTCC) or Rogers Duroid™.

Figure 9B:
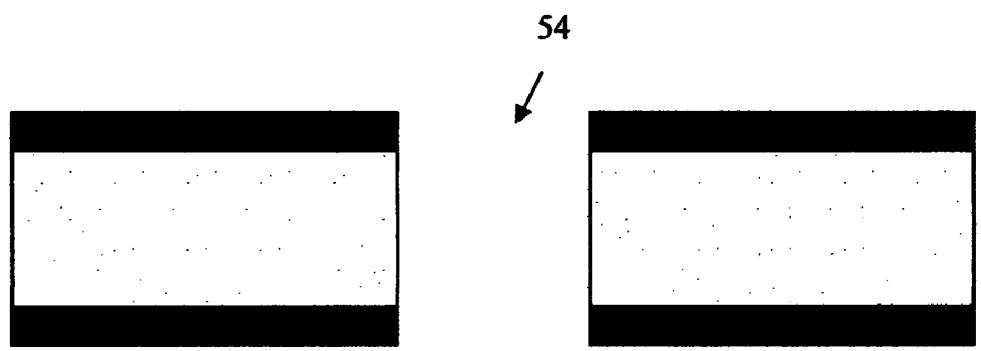

FIG. 9b shows that a through hole 54 is formed. Mechanical or laser drilling can be used for the construction of the through hole.

Figure 9C:
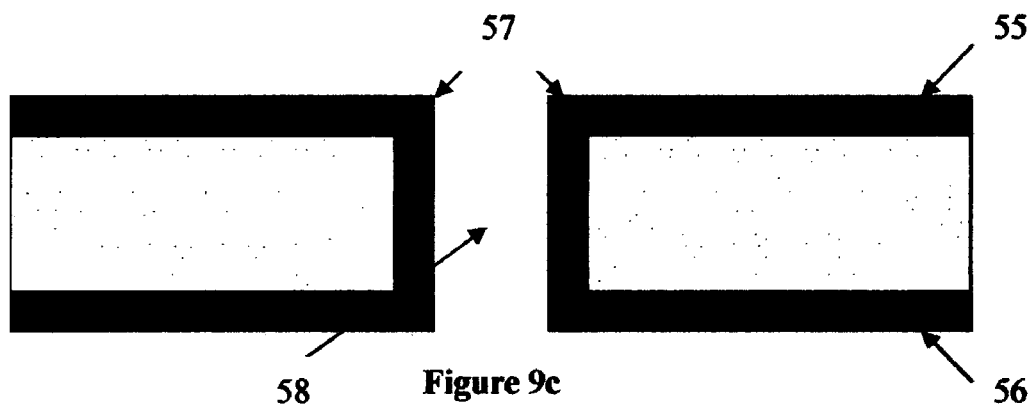

FIG. 9c shows that the through hole 58 is plated with conductive metal 57 to connect electrically with the planes 55 and 56.

Figure 9D:
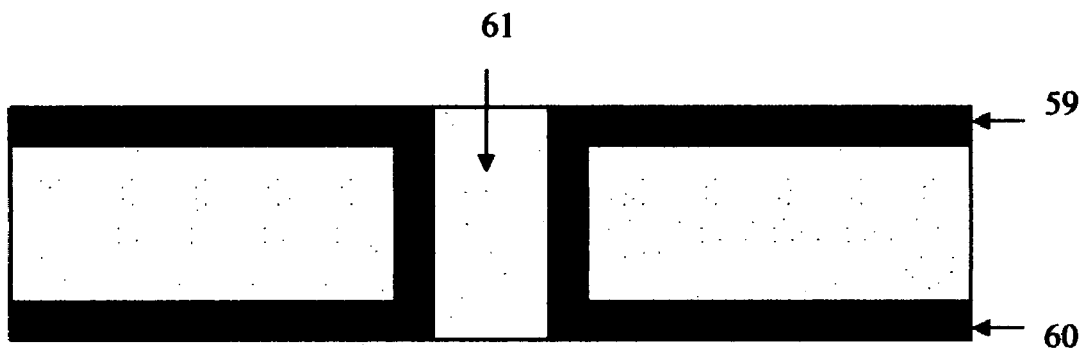

FIG. 9d shows that the plated through hole 58 in FIG. 9c is filled with dielectric material 61. The dielectric material 61 can be properly optimally selected to control the impedance of the signal via. Chemical vapor deposition can be applied to fill the hole. Many other possible techniques can be applied as well. The details of those well-known techniques are not discussed here.

Figure 9E:
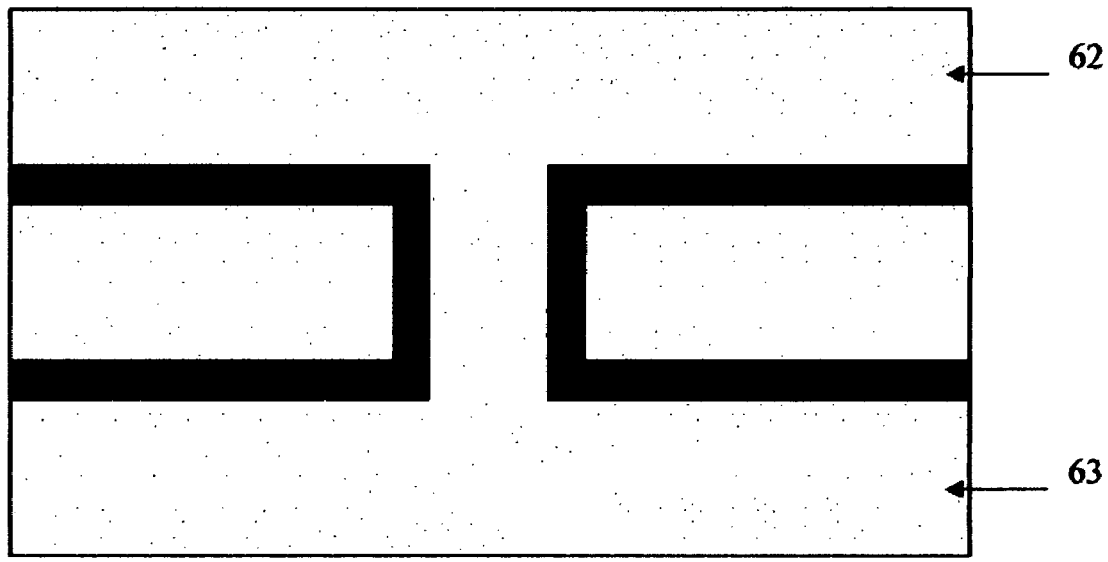

FIG. 9e shows that two sheets of dielectric material 62 and 63 are stuck to both sides of the substrate. To adhere the dielectric material with the substrate, the processes of heating and hardening will be needed.

Figure 9F:
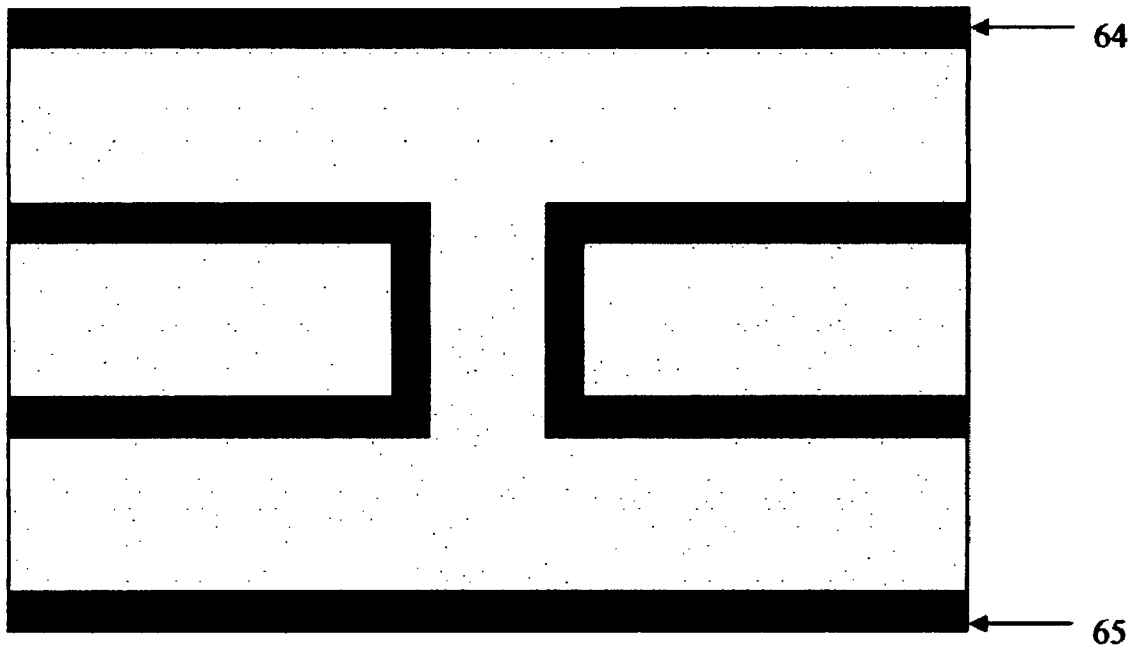

FIG. 9f shows that the top and bottom sides of the substrate are constructed with conductive metal 64 and 65. Chemical vapor deposition or other known techniques can be used for depositing the conductive metal.

Figure 9G:
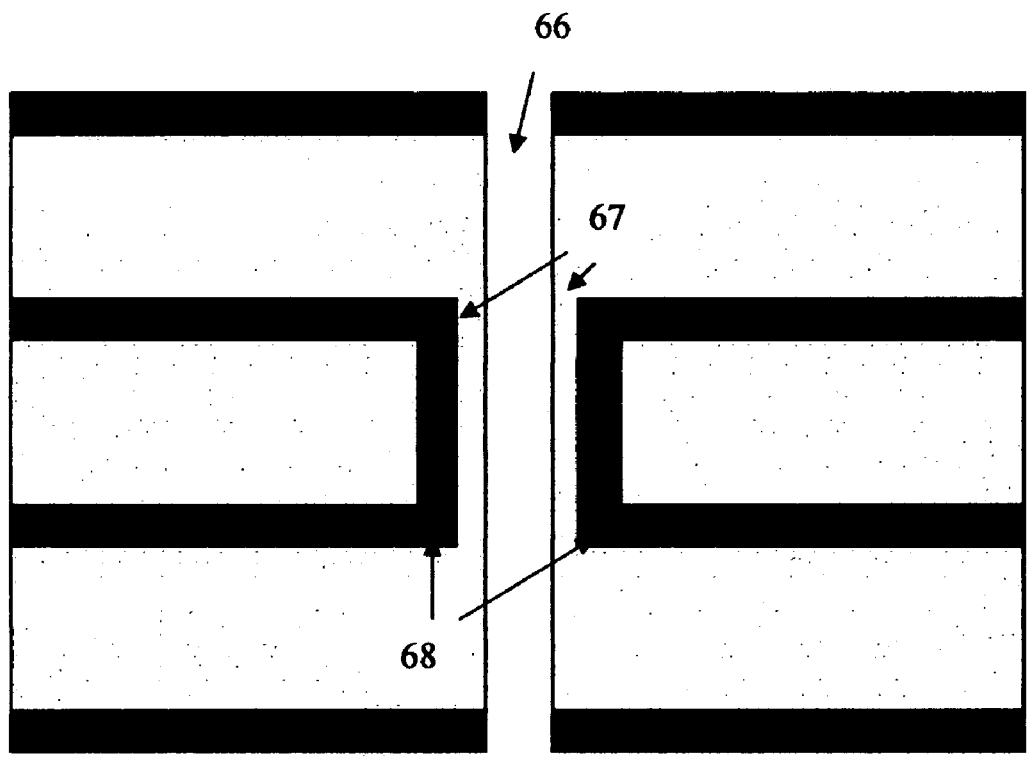

FIG. 9g illustrates how the through hole 66 is constructed. Mechanical or laser drilling can be used for the construction of this through hole. The gap (anti-pad) 67 between the through hole 66 and the plated via 68 can be properly designed to control the impedance of the signal via.

Figure 9H:
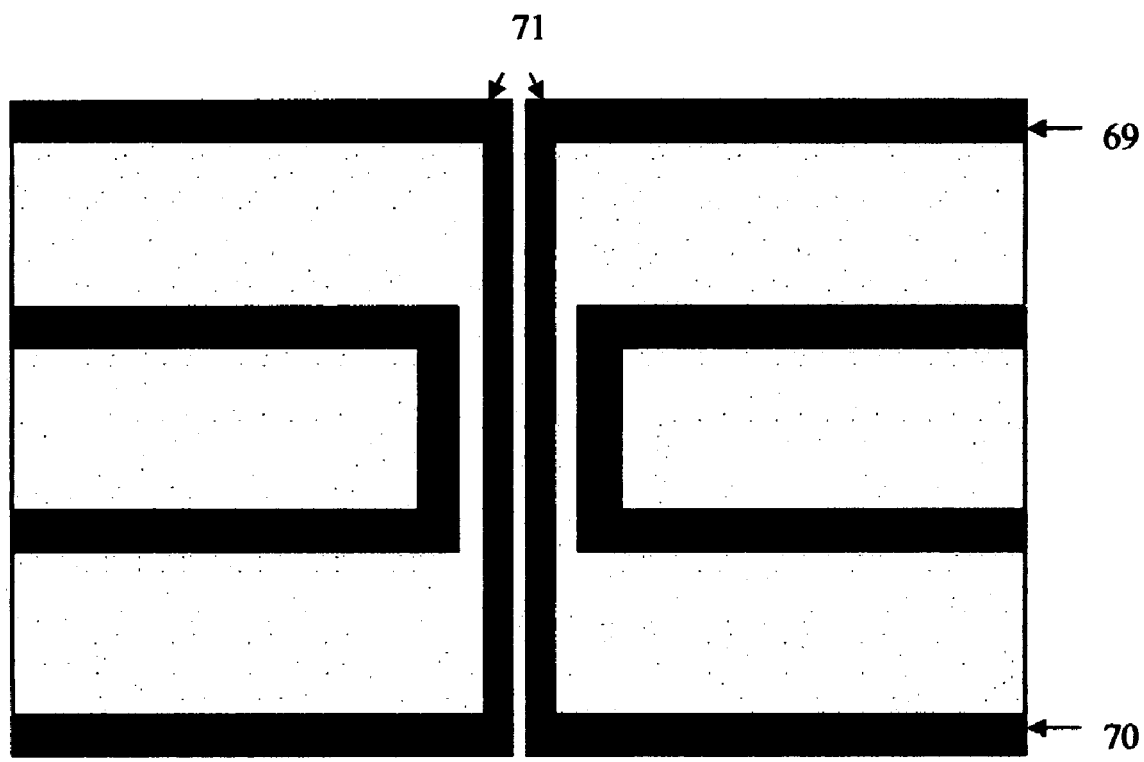
Figure 9I:
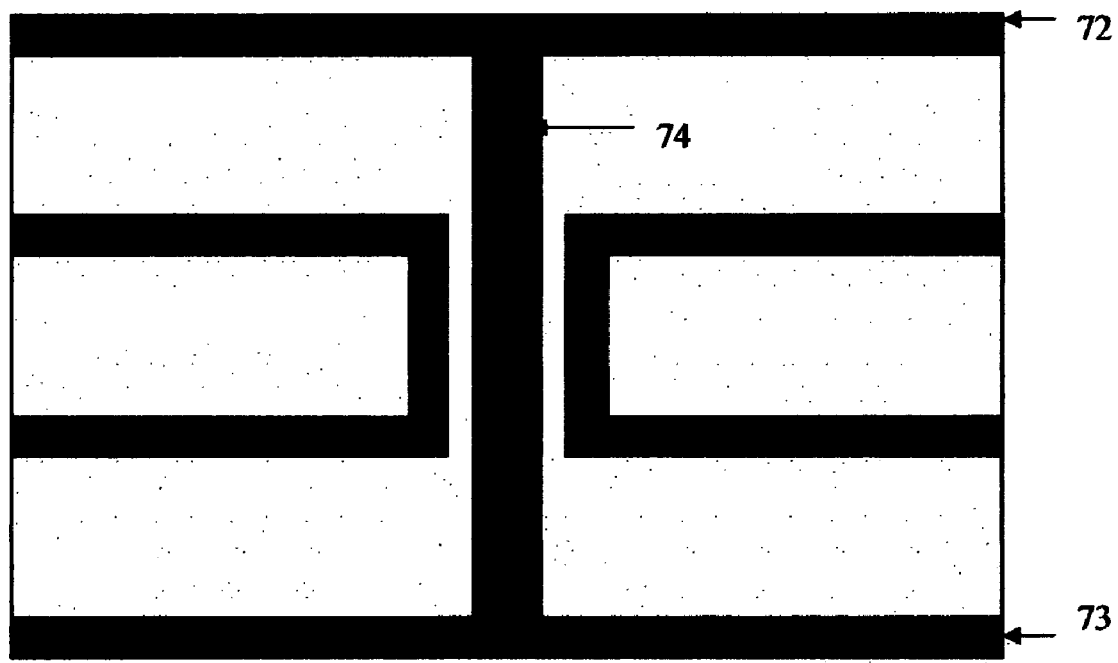

FIG. 9h shows that the through hole 66 in FIG. 9g is plated with conductive metal 71 to connect the conductive metal 69 and 70 on the top and the bottom sides. The through hole 66 in FIG. 9g can be also filled with conductive metal 74 as shown in FIG. 9i to connect the conductive metal 72 and 73 on the top and the bottom sides, respectively.

Figure 9J:
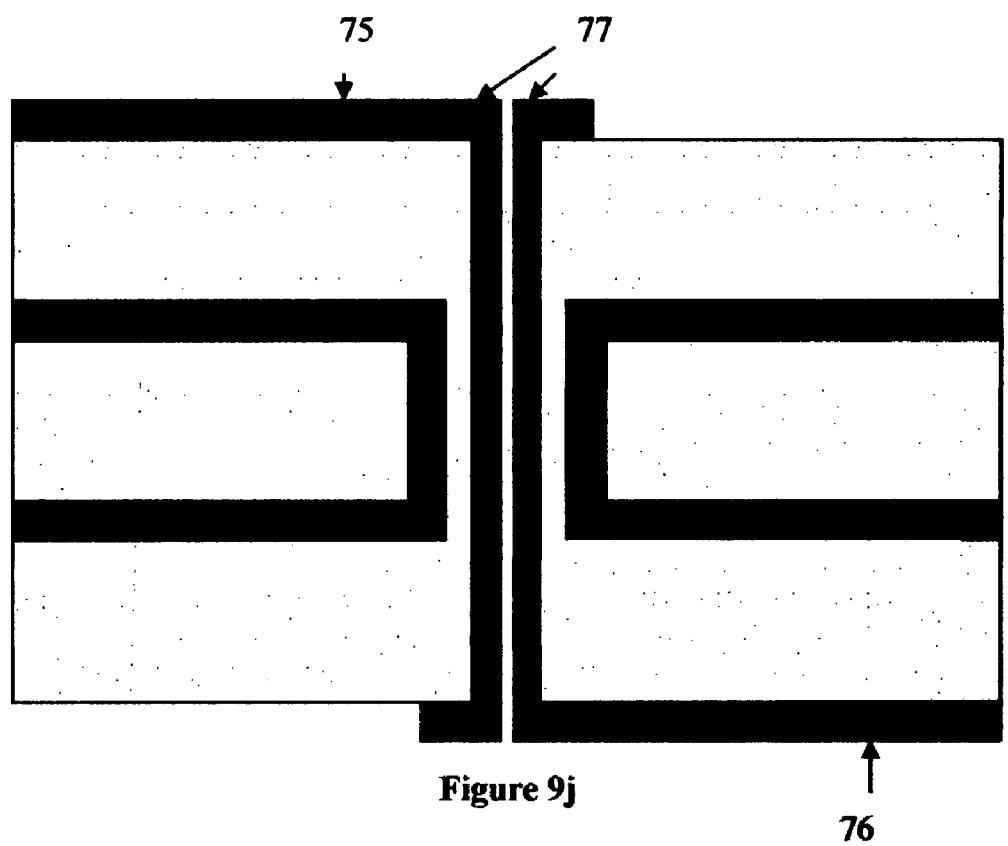

FIG. 9j shows that the conductive metal 69 and 70 in the FIG. 9h is formed into signal traces 75 and 76. The formation of the signal traces 75 and 76 can be achieved by using typical PCB fabrication techniques. Finally, the signal traces 75 and 76 are connected electrically with the conductive metal 77. Again, FIG. 9k shows that the conductive metal 72 and 73 in the FIG. 9i is formed into signal traces 78 and 79. The formation of the signal traces 78 and 79 can be achieved by using typical PCB fabrication techniques as well. Eventually, the signal traces 78 and 79 are connected electrically with the conductive metal 80.

FIGS. 10a-10d shows the same fabrication processes illustrated in FIGS. 9a-9d.

Figure 10D:
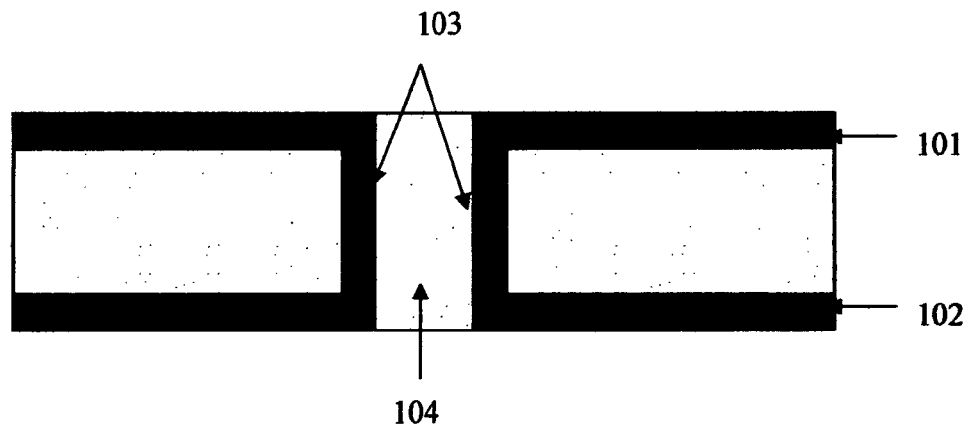
Figure 10E:
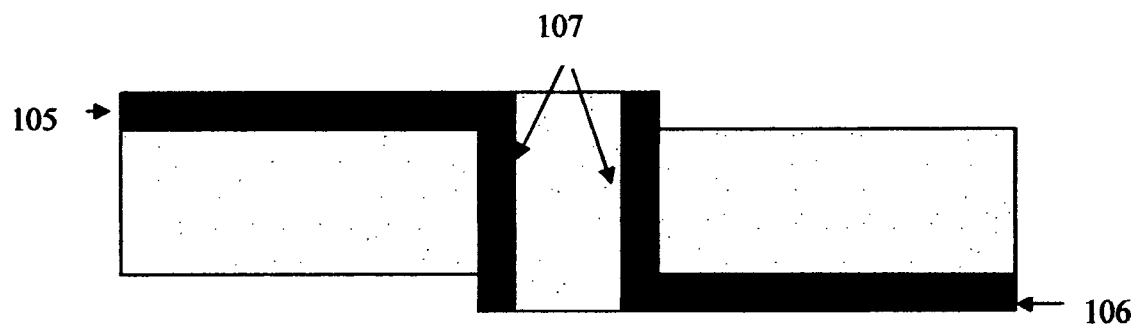

FIG. 10e shows that the conductive metal 101 and 102 in FIG. 10d is formed into signal traces 105 and 106. The formation of the signal traces 105 and 106 can be achieved by using typical PCB fabrication techniques. Finally, the signal traces 105 and 106 are connected electrically with the conductive metal 107.

Figure 10F:
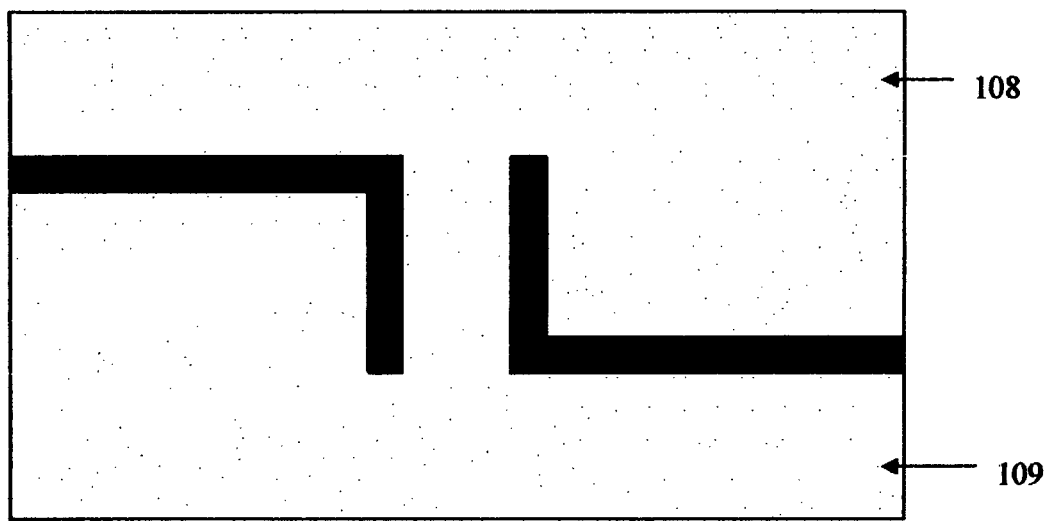

FIG. 10f shows that two sheets of dielectric material 108 and 109 are stuck to both sides of the substrate. To adhere the dielectric material to the substrate, the processes of heating and hardening will be needed.

Figure 10G:
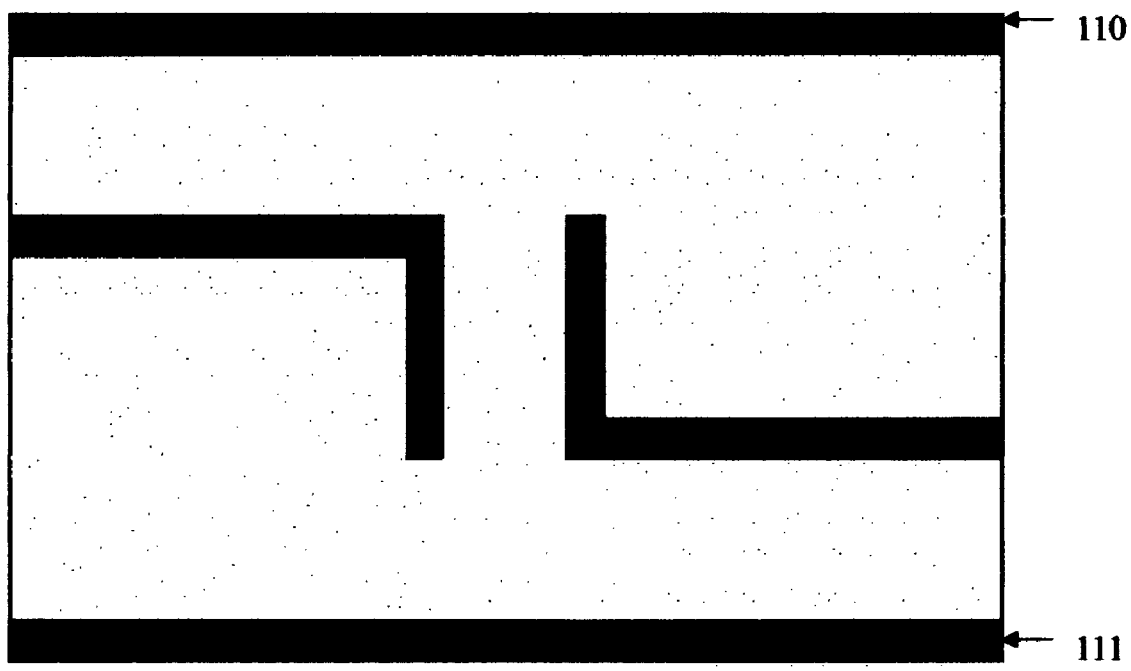

FIG. 10g shows that the top and bottom sides of the substrate are constructed with conductive metal 110 and 111. Chemical vapor deposition or other known techniques can be used for constructing the conductive metal.

Figure 10H:
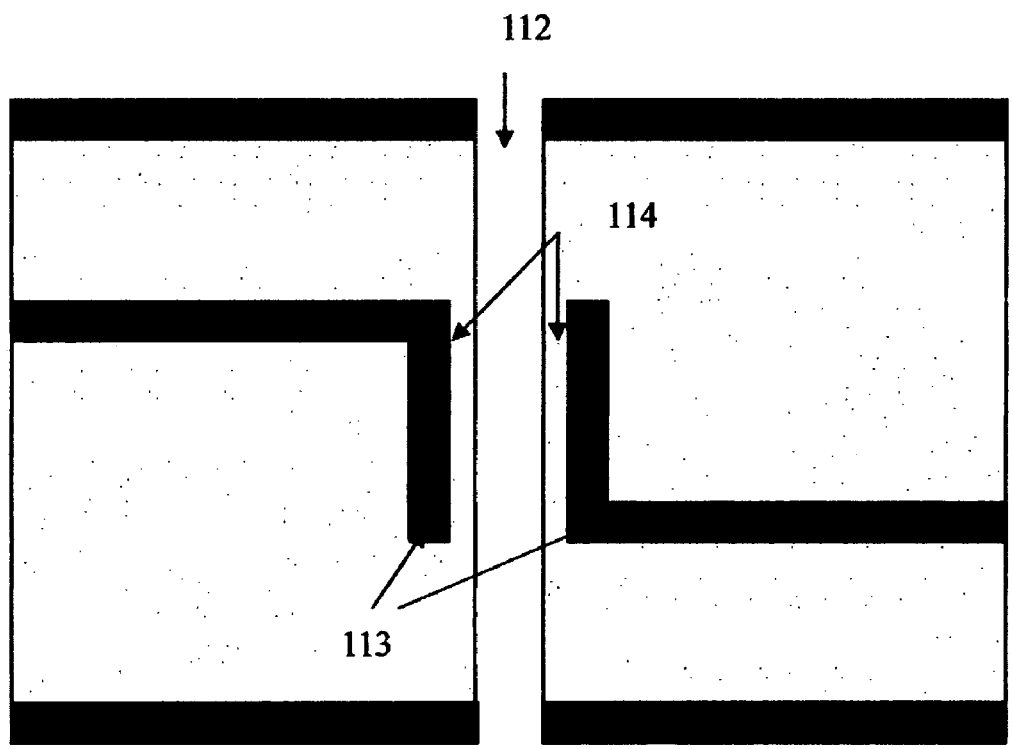

FIG. 10h illustrates how the through hole 112 is constructed. Mechanical or laser drilling can be used for the construction of the through hole 12. The gap (anti-pad) 114 between the through hole 112 and the plated via 114 can be properly designed to control the impedance of the signal via later.

Figure 10I:
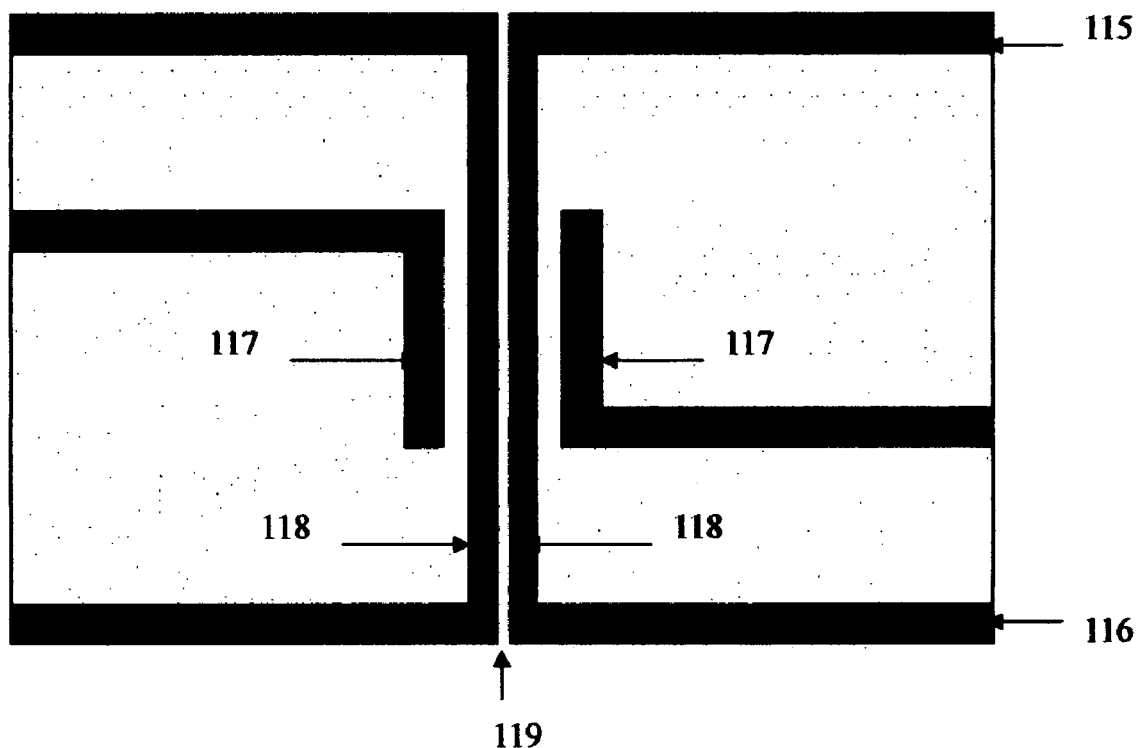
Figure 10J:
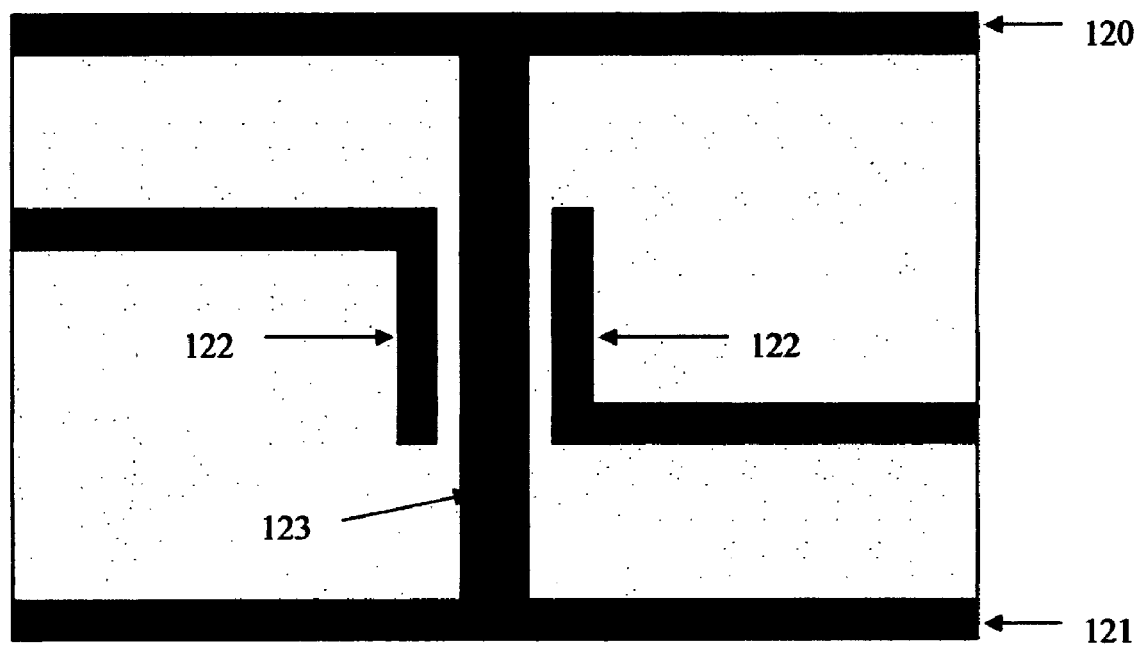

FIG. 10i shows that the through hole 112 in FIG. 10h, which is plated with conductive metal 118, is to be connected to the conductive metal 115 and 116 on the top and the bottom sides, respectively. However, the through hole 112 in FIG. 10h can also be filled with conductive metal 123, as shown in FIG. 10j, to connect the conductive metal 120 and 121 on the top and the bottom sides, respectively.

Figure 5:
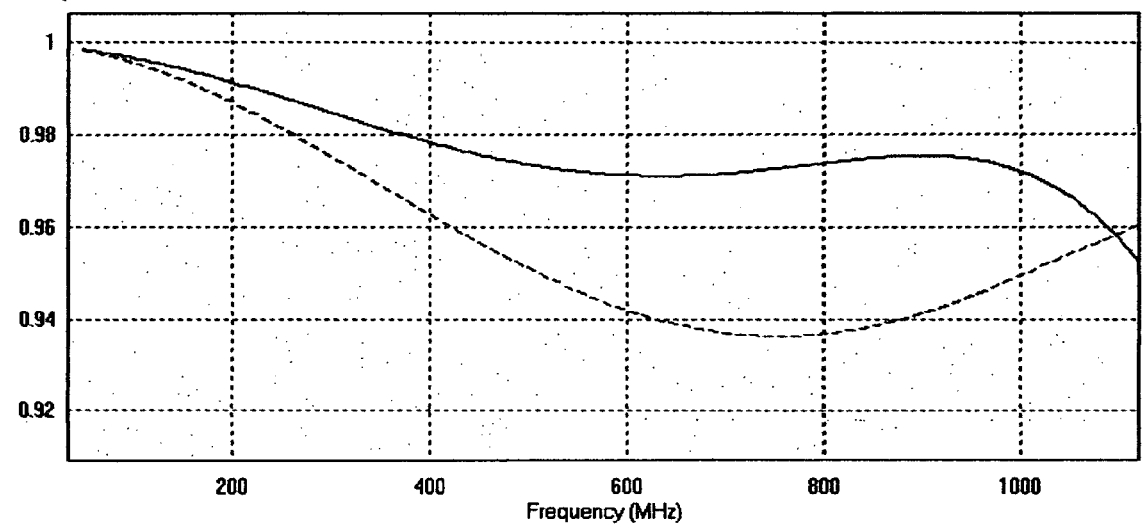
FIG. 5 shows the simulated insertion loss ($S_{21}$) of the PCB board-level size of the microstrip-like via. The dashed line represents the magnitudes of the simulated $S_{21}$ values predicted for the structure show in FIG. 1: The solid line represents the magnitudes of the simulated $S_{21}$ values predicted for the structure shown in FIG. 2.
Figure 6:
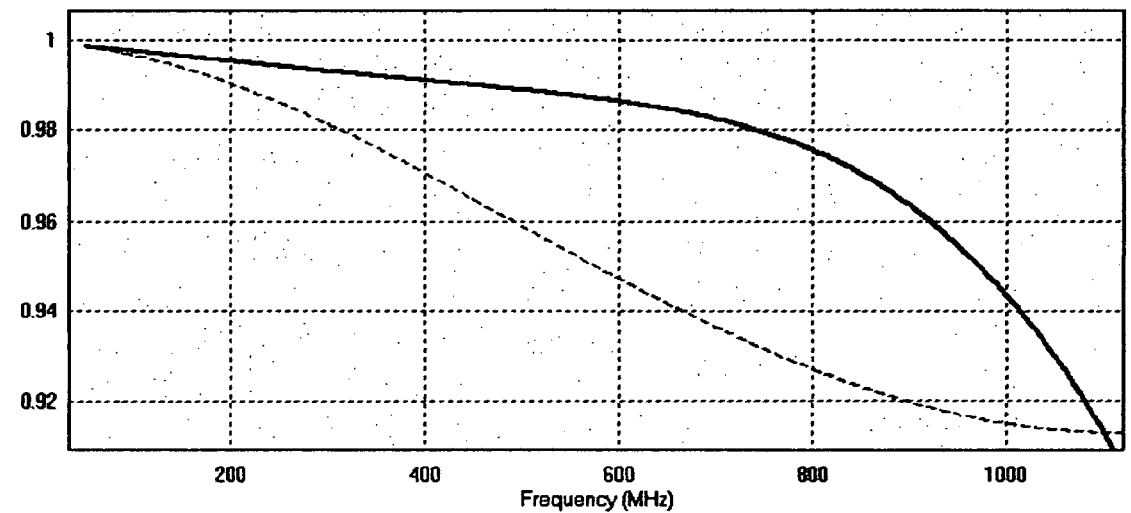
FIG. 6 shows the simulated insertion loss ($S_{21}$) of the PCB board-level size of the stripline-like via. The dashed line represents the magnitudes of the simulated $S_{21}$ values predicted for the structure shown in FIG. 3. The solid line represents the magnitudes of the simulated $S_{21}$ values predicted for the structure shown in FIG. 4.

Simulations were explored with printed circuit board (PCB) and integrated circuit packaging to confirm the performance of the two types of via structures that comprise the invention: type A (see FIG. 2), a novel microstrip-like via, and type B (see FIG. 4), a novel stripline-like via. FIG. 5 and FIG. 6 are the simulation results for the typical size of the PCB-level via structures. FIG. 5 shows the simulated insertion losses ($S_{21}$) of the microstrip-like via (see FIG. 1 and FIG. 2). The simulation results for two via structures are shown: a) the via structure without power via (or ground via) (see FIG. 1), and b) the via structure with power via (or ground via) (see FIG. 2). The solid and dashed curves represent the via structures with and without the power via (or ground via), respectively. It is clearly shown that the insertion loss ($S_{21}$) of the via structure with the power via (or ground via) is larger than that of the via structure without the power via (or ground via) when the signal frequency is under about 1.07 GHz. These results indicate that the signal will be transmitted more effectively when the via structure with power via (or ground via) is used. In other words, the signal integrity is improved.

FIG. 6 shows the simulated insertion losses ($S_{21}$) of the stripline-like via (see FIG. 3 and FIG. 4). Two via structures are simulated: a) the via structure without the power via (or ground via) (see FIG. 3), and b) the via structure with the power via (or ground via) (see FIG. 4). The solid and dashed curves represent the via structures with and without the power via (or ground via), respectively. Obviously, the insertion loss ($S_{21}$) of the via structure with the power via (or ground via) is larger than that of the via structure without the power via (or ground via) when the signal frequency is under about 1.07 GHz. These results indicate that the signal will be transmitted more effectively when the via structure with the power via (or ground via) is used. In other words, the signal integrity is improved.

Figure 7:
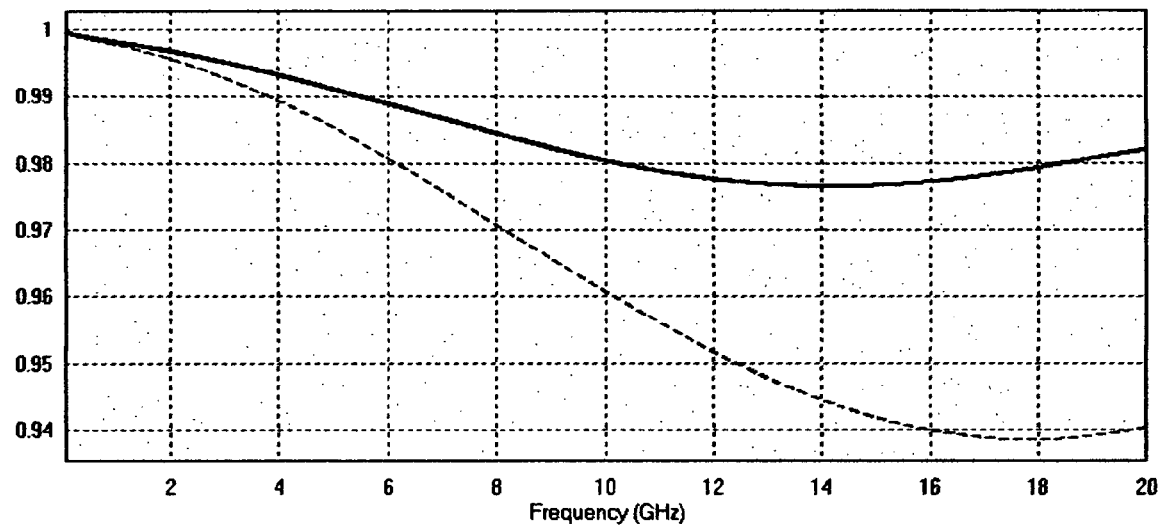
FIG. 7 shows the simulated insertion loss ($S_{21}$) of the IC packaging-level size of the microstrip-like via. The dashed line represents the magnitudes of the simulated $S_{21}$ values predicted for the structure shown in FIG. 1. The solid line represents the magnitudes of the simulated $S_{21}$ values predicted for the structure shown in FIG. 2.
Figure 8:
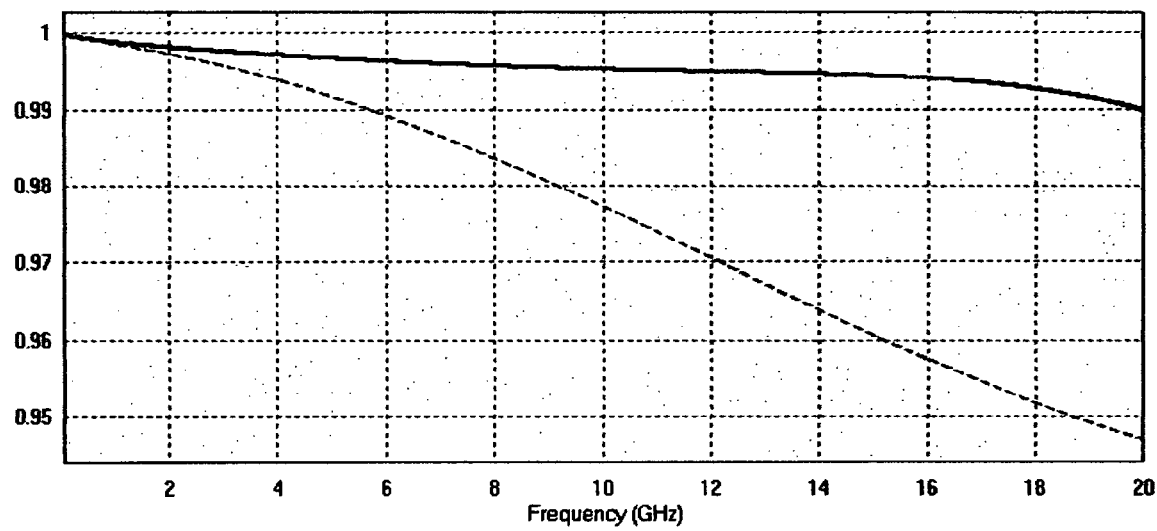
FIG. 8 shows the simulated insertion loss ($S_{21}$) of the IC packaging-level size of the stripline-like via. The dashed line represents the magnitudes of the simulated $S_{21}$ values predicted for the structure shown in FIG. 3. The solid line represents the magnitudes of the simulated $S_{21}$ values predicted for the structure shown M FIG. 4.

Similarly, FIG. 7 and FIG. 8 are the simulation results for the IC packaging-level via structures. FIG. 7 shows the simulated insertion losses ($S_{21}$) of the microstrip-like via (see FIG. 1 and FIG. 2). The solid and dashed curves represent the via structures with and without the power via (or ground via), respectively. Obviously, the insertion loss ($S_{21}$) of the via structure with the power via (or ground via) is larger than that of the via structure without the power via (or ground via) when the signal frequency is under 20 GHz. These results indicate that the signal will be transmitted more effectively when the via structure with the power via (or ground via) is used. Consequently, the signal integrity will be improved.

FIG. 8 shows the simulated insertion losses ($S_{21}$) of the stripline-like via (see FIG. 3 and FIG. 4). The solid and dashed curves represent the via structures with and without the power via (or ground via), respectively. Obviously, the insertion loss ($S_{21}$) of the via structure with the power via (or ground via) is larger than that of the via structure without the power via (or ground via) when the signal frequency is under 20 GHz. These results indicate that the signal will be transmitted more effectively when the via structure with the power via (or ground via) is used. Consequently, the signal integrity will be improved.

The embodiments of the invention comprise the improved via structures (the additional power via or ground via), both via types having the same method of fabrication. The power via (or ground via) will connect the two power planes (or the two ground planes). It provides the shortest current return path and reduces the impedance discontinuity. The thickness of the power via (or ground via) must be larger than the skin depth associated with the frequency of the signal. Therefore, the EM waves generated by the signal via will not penetrate through the power via (or ground via). Therefore, the insertion loss will be improved. Also, the EM field will be concentrated between the signal via and power via (or ground via) and, consequently, the signal via will couple less energy with any other via. As a result, the signal integrity will be improved.

In short, the inventive concepts unveiled herein are the basic examples and can be modified. Any modification based any extension of the inventive concepts fall within the scope of the appended claims and their equivalents; and consequently, they should be covered by this patent.

What is claimed is:

1. A via structure in a circuit board or substrate having multiple layers, from top to bottom comprising:
    a first power plane or a first ground plane in the first layer;
    a first medium in a second layer;
    a first signal trace in a third layer;
    a second medium in a fourth layer;
    a second signal trace in a fifth layer;
    a third medium in a sixth layer;
    a second power plane or a second ground plane in a seventh layer;
    a power via or a ground via passing through the first medium, the first signal trace, the second medium, the second signal trace, and the third medium, wherein the first power plane or the first ground plane is connected with the second power plane or the second ground plane through the power via or the ground via;
    a signal via passing through the second medium around the power via, and the first signal trace is connected with the second signal trace through the signal via; and
    an anti-pad is located between the signal via and the power via or a ground via,
    wherein the power via or the ground via is cylindrical and the thickness of the power via or the ground via is larger than the skin depth at the frequency of the signal; and
    when a signal going through a path from the first signal trace through the signal via to the second signal trace, the signal goes through the path with complete impedance continuity.

2. The via structure of claim 1, wherein the first power plane or the first ground plane in the first layer and the second power plane or the second ground plane in the seventh layer have to have the same potential.

3. The via structure of claim 1, wherein the power via or the ground via is either a solid cylindrical or a cylindrical ring.

4. The via structure of claim 1, wherein the signal via are concentric to the power via or the ground via.

5. The via structure of claim 1, wherein the circuit structure comprises a printed circuit board and integrated circuit packaging.

6. The via structure of claim 1, wherein the power plane or the ground plane is deformed to a power grid or a ground grid on die.

7. A via structure, comprising:
    a circuit board having multiple power planes, ground planes and medium layers, wherein a power via or a ground via passes through the power planes, ground planes and medium layers along a same axis, and wherein a signal via passes through the medium layers around a power or the ground via;
    one of the multiple power planes or the ground planes connects with a different power plane or the ground via through the power via or the ground via;
    the power via or the ground via may connect all of the multiple power planes or the ground planes with same potential;
    the power via or the ground via is cylindrical and the thickness of the power via or the ground via is larger than the skin depth at the frequency of the signal; and
    when a signal going through the signal via, the signal goes through the signal via with complete impedance continuity.

8. The via structure of claim 7, wherein the signal via is concentric with the power via or the ground via.

9. The via structure of claim 7, wherein the signal via and power via or the ground via can be not only circular but also square, rectangular, or any shape.

10. The via structure of claim 7, wherein the distance between the signal via and the power via or the ground via is properly designed for impedance control of the signal via.

11. The via structure of claim 7, the dielectric material between signal via and the power via or the ground via is properly selected for impedance control of the signal via.

12. The via structure of claim 7, wherein the signal via and the power via or the ground via are perpendicular to the power planes or the ground planes of the circuit board.

13. The via structure of claim 7, wherein the signal via and power via or the ground via are located in the dielectric.

* * * * *